United States Patent [19]

Lur

[11] Patent Number: 5,453,395
[45] Date of Patent: Sep. 26, 1995

[54] ISOLATION TECHNOLOGY USING LIQUID PHASE DEPOSITION

[75] Inventor: Water Lur, Taipei, Taiwan

[73] Assignee: United Microelectronics Corp., Hsinchu, Taiwan

[21] Appl. No.: 215,227

[22] Filed: Mar. 21, 1994

[51] Int. Cl.$^6$ .................................................. H01L 21/76
[52] U.S. Cl. .................................................. 437/67
[58] Field of Search ................ 437/67; 148/DIG. 50, 148/DIG. 85, DIG. 86

[56] References Cited

U.S. PATENT DOCUMENTS 5,256,593  10/1993  Iwai .

FOREIGN PATENT DOCUMENTS

| 59-208729 | 11/1984 | Japan . |
| 63-142831 | 6/1988 | Japan . |
| 4106954 | 4/1992 | Japan . |
| 4132240 | 5/1992 | Japan . |
| 4245662 | 9/1992 | Japan . |

*Primary Examiner*—George Fourson
*Attorney, Agent, or Firm*—Ladas & Parry

[57] ABSTRACT

A method of forming an isolation structure on a silicon substrate using liquid phase deposition which is capable of selectively depositing oxide only in trenches of the substrate, to grow recessed field oxides of same height, and leave a flat surface of the substrate. The liquid phase deposition is performed using saturated hydrofluosilicic acid as a reactant.

18 Claims, 4 Drawing Sheets

ISOLATION TECHNOLOGY USING LIQUID PHASE DEPOSITION

FIELD OF THE INVENTION

The present invention relates to a method of forming an isolation structure of an integrated circuit (IC) device, especially to a method of forming an isolation structure of an integrated circuit using selective liquid-phase-deposition (LPD), of silicon dioxide.

BACKGROUND OF THE INVENTION

With the continual improvement of semiconductor chip fabrication techniques, the number of devices which can be packed onto a semiconductor chip has increased greatly, while the size of the individual devices have decreased markedly. Today several million devices can be fabricated in a single chip—consider, for example, the mega-bit memory chips which are commonly used today in personal computers and in other applications. In such high-density chips, elements must be insulated properly in order to obtain good performance. The main purpose of element insulation techniques is to provide good insulation between the elements of the devices using smaller insulation area, to provide more space for more devices and their elements.

In the past, the so-called LOCal Oxidation of Silicon (LOCOS) technique has been widely used in the art of insulation of integrated circuit chips. According to this method, a thick oxide is grown as an insulating layer, to insulate the elements. FIGS. 1A to 1D demonstrate the prior art LOCOS technique. At first, a pad oxide layer 11 and then a silicon nitride layer 12 are formed on a silicon substrate 10. Those layers are patterned using lithography and etching techniques, yielding the structure shown in FIG. 1A. After that, impurities of a type to form a channel-stop are implanted in the uncovered portion of the substrate 10, to form a channel stop implantation layer 13, as shown in FIG. 1B.

Referring to FIG. 1C, a thick field oxide 14 is formed by thermal oxidization. Since the oxidizing speed of silicon nitride is less than that of silicon, the silicon nitride layer 12 works like a mask against thermal oxidization, so the field oxide grows only where the substrate 10 is not covered by the silicon nitride layer 12. Finally, silicon nitride layer 12 is removed to obtain the isolation structure shown in FIG. 1D.

The above described conventional LOCOS technique has a number of disadvantages, which become rather unacceptable when attempting to apply this technique to the fabrication of sub-micron devices. First, the oxidization of silicon does not happen only in the vertical direction but also in the horizontal direction. As a result, a part of the field oxide grows under the adjacent silicon nitride layer 12 and lifts it up, as can be seen in FIG. 1C. This is termed the "bird's beak effect" by persons skilled in the art. Secondly, due to the stresses caused by the bird's beak effect, a part of nitride in the compressed regions of silicon nitride layer 12 diffuses to adjacent tensile strained regions at the interface of the pad oxide layer 11 and the substrate 10, and forms a silicon-nitride-like region 15. In later processing to form gate oxides, the gate oxides will be thinned due to the mask effect of the silicon-nitride-like layer 15. It is termed "white ribbon effect" because a white ribbon will appear at the edges of active regions under optical microscopes.

Additionally, because the volume of silicon dioxide is 2.2 times as large as that of silicon, the field oxide 14 protrudes from the surface of the silicon substrate 10, forming a non-recessed surface. Furthermore, the channel stop implantation layer 13 will diffused laterally during the high temperature oxidation of the silicon used in forming the field oxide 14, which reduces the width of adjacent active regions. Decreasing the width of those active regions is a disadvantage when one is trying to scale down the dimensions of the device. Additionally, due to the lateral expansion of the field oxide 14 during oxidation, there is a lot of stress which occurs in the active region. Many crystalline defects are produced near the bird's beak regions, and result in an increase of junction leakage and a reduction of the reliability of the devices.

Many modified processes have been promoted to overcome the above-discussed disadvantages of LOCOS, such as: adding a spacer to reduce the bird's beak effect, adding a sacrificial oxide layer to solve the white ribbon effect, or forming a trench before depositing field oxide layer to obtain a flat surface. Each of these suggestions solves some of the disadvantages of LOCOS, but they also increase the complexity of entire processes and, at the same time, and reduce production efficiency.

Trench isolation is another modified LOCOS technique which has been utilized in an attempt to overcome the disadvantages of LOCOS. In this technique, trenches are etched on the silicon substrate and then a field oxide layer is deposited to fill the trenches, so as to form a recessed isolation layer. This technique uses chemical vapor deposition (CVD) to form the field oxide layer. The field oxide layer is deposited on the entire surface of the substrate, including in the trenches, and therefore further processing is needed to remove oxide from active regions. Furthermore, the field oxide does not only grow vertically from the bottom of the trenches, but also laterally from the sidewalls of the trenches. Since a typical semiconductor chip would have numerous trenches of varying widths, when the comparatively narrow trenches have been filled up, the comparatively wide trenches have not been fully filled. If the deposition process is extended to fill the wide trenches, the field oxide formed in the narrow trenches will be too thick, causing a non-recessed surface to occur which, in turn, presents certain disadvantages during later processing, as is well known by those skilled in the art.

SUMMARY OF THE INVENTION

The object of the present invention is to provide a method of forming an isolation structure for an integrated circuit, in which field oxide is selectively grown in trenches, and vertically grown from the bottom of the trenches, without lateral deposition, therefore forming field oxides of the same height in every trench.

The above object is fulfilled by providing a method of forming an isolation structure on a silicon substrate. The method may comprises the following steps: (a) forming at least one trench on said silicon substrate; (b) forming a first oxide layer on a surface of said silicon substrate and sidewalls as well as the bottom of the trench; (c) forming a adhesive layer on the first oxide layer; (d) forming a tungsten layer on the adhesive layer; (e) coating and patterning a photoresist on the tungsten layer to expose the trench; (f) removing the tungsten layer and the adhesive layer on the bottom of the trench by etching using the photoresist as a mask; (g) forming a second oxide layer to fill the trench using liquid phase deposition; (h) removing the photoresist; (i) removing the tungsten layer and the adhesive layer to leave gaps between the first oxide layer and the second oxide layer; (j) densifying the second oxide layer by heating; (k) forming a dielectric layer to fill the gaps using deposition and etching back; and (1) removing the first oxide layer on the surface of the silicon substrate.

In general terms the present invention provides a method of forming an isolation structure on a semiconductor substrate. The method comprises the steps of forming at least one trench in the substrate; forming a relatively thin oxide layer on at least a bottom of the at least one trench; forming a protective layer on the substrate and in the at least one trench, the protective layer being provided with an aperture therein over the bottom of the at least one trench; and forming a relatively thick field oxide layer on the relatively thin oxide layer in the at least one trench by liquid phase deposition of field oxide.

BRIEF DESCRIPTION OF THE DRAWING

The present invention will be more fully understood from the following detailed description with reference to the accompanying drawings which are given by way of illustration only, and thus are not limitative of the present invention and wherein.

DETAILED DESCRIPTION OF THE PREFERRED EMBODIMENT

Figure 1A:
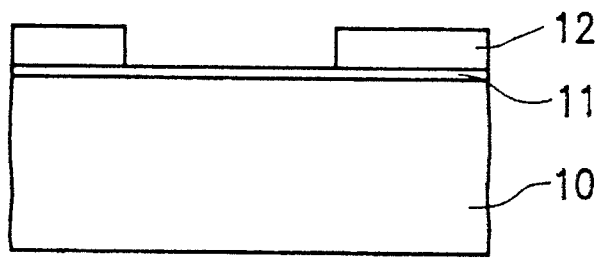
FIGS. 1A to 1D are cross-sectional views showing the process steps using conventional LOCOS technique.
Figure 1B:
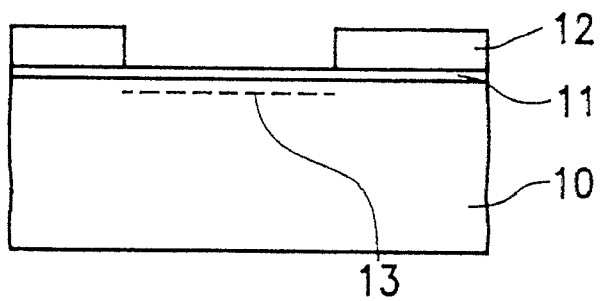
Figure 1C:
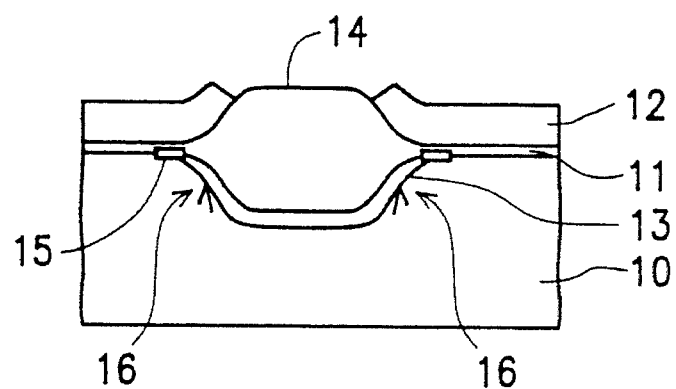
Figure 1D:
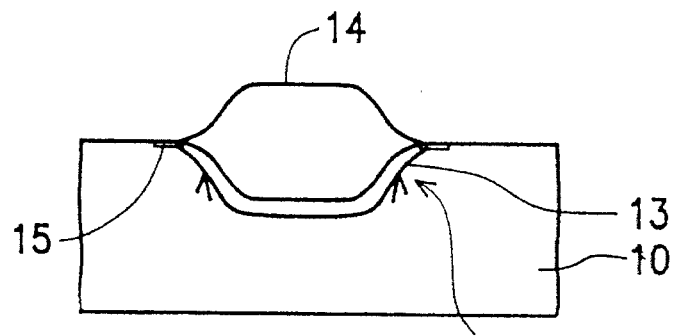
Figure 2A:
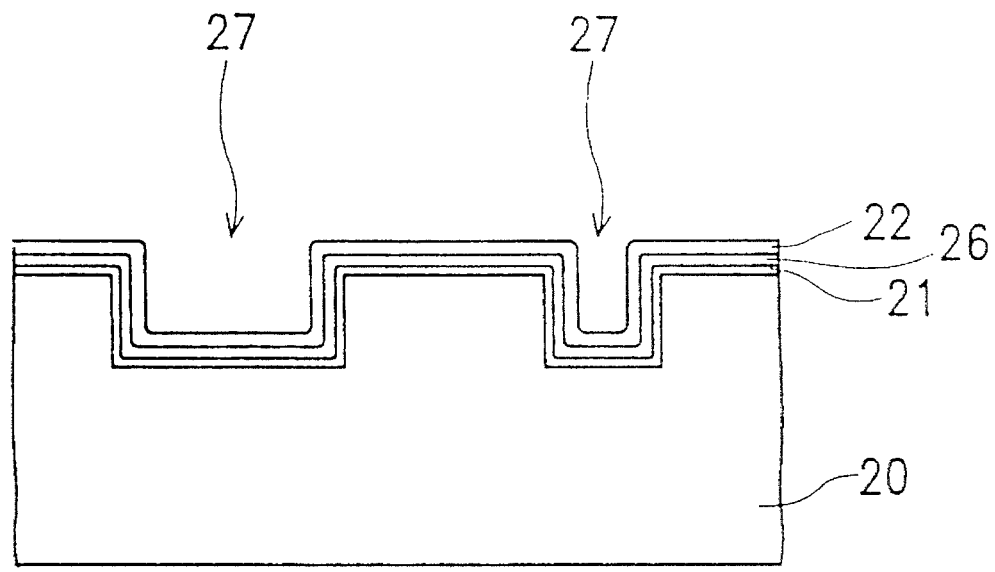
FIGS. 2A to 2E are cross-sectional views showing the process steps of the method according to the present invention.

Referring to FIG. 2A, trenches 27 are formed in a silicon substrate 20 by etching. This can be done by conventional reactive ion etching (RIE) techniques or other anisotropic etching techniques. An oxide layer 21 having a thickness between 50 Å to 200 Å is formed on the surface of the substrate 20 and the bottom and the sidewalls of the trenches 27 by, for example, thermal oxidation. Then a titanium nitride (TIN) or titanium-tungsten alloy (Ti:W) layer 26 having a thickness between 100 Å and 500 Å, and a tungsten layer 22 having a thickness between 500 Å and 2000 Å are serially formed on the oxide layer 21 by chemical vapor deposition (CVD) or physical vapor deposition (PVD). The step coverage ratio of the tungsten layer 22 is preferably between 40% to 95%. The TiN or Ti:W layer 26 deposited between the oxide layer 21 and the tungsten layer 22 is used to solve the problem of poor adhesion between the protective tungsten layer 22 and oxide layer 21.

Figure 2B:
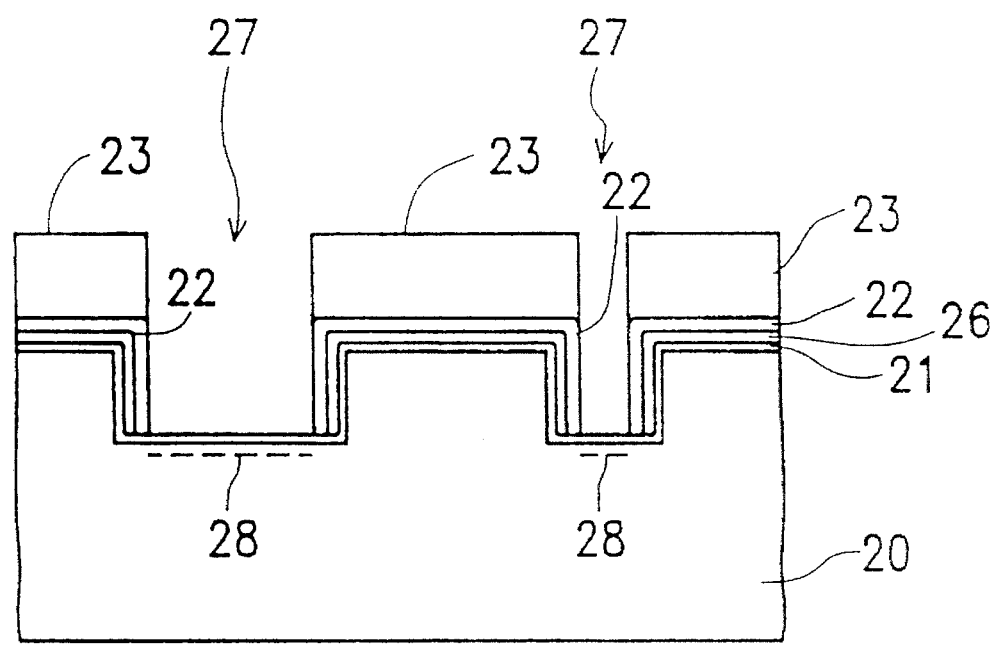

Referring to FIG. 2B, a photoresist 23 is coated on the substrate 20 and patterned to expose the trenches 27 using conventional lithography techniques. The critical dimension bias is between 0 to −0.1 μm when patterning the photoresist 23. Then portions of the tungsten layer 22 and the TiN or Ti:W layer 26 at the bottom of the trenches 27 are etched by RIE, using $SF_6$ or the like as reactive gas and the photoresist 23 as a mask. Impurities can be implanted beneath the bottom of the trenches 27 to form a channel stop implantation layer 28 at this time.

Figure 2C:
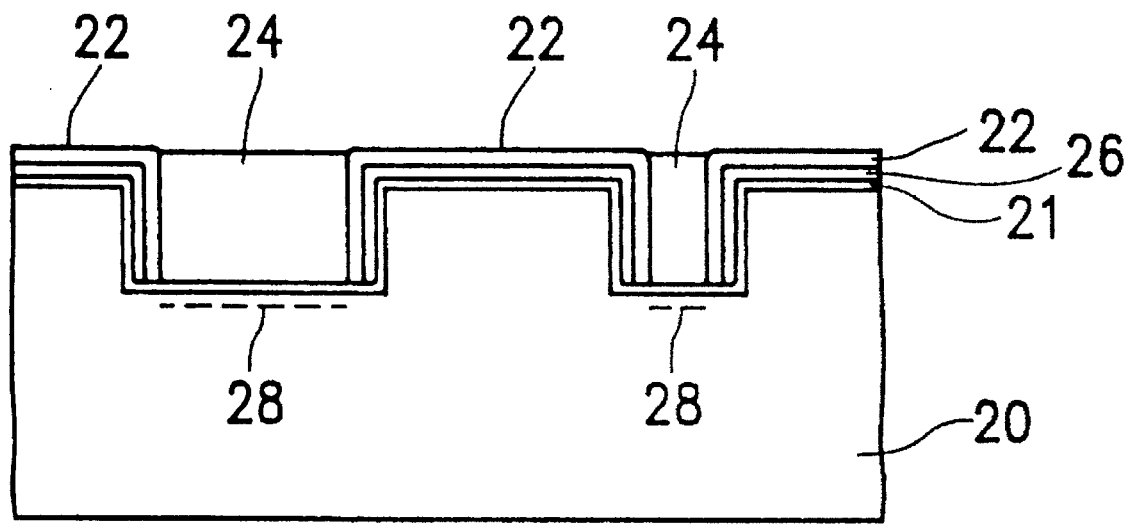
Figure 3:
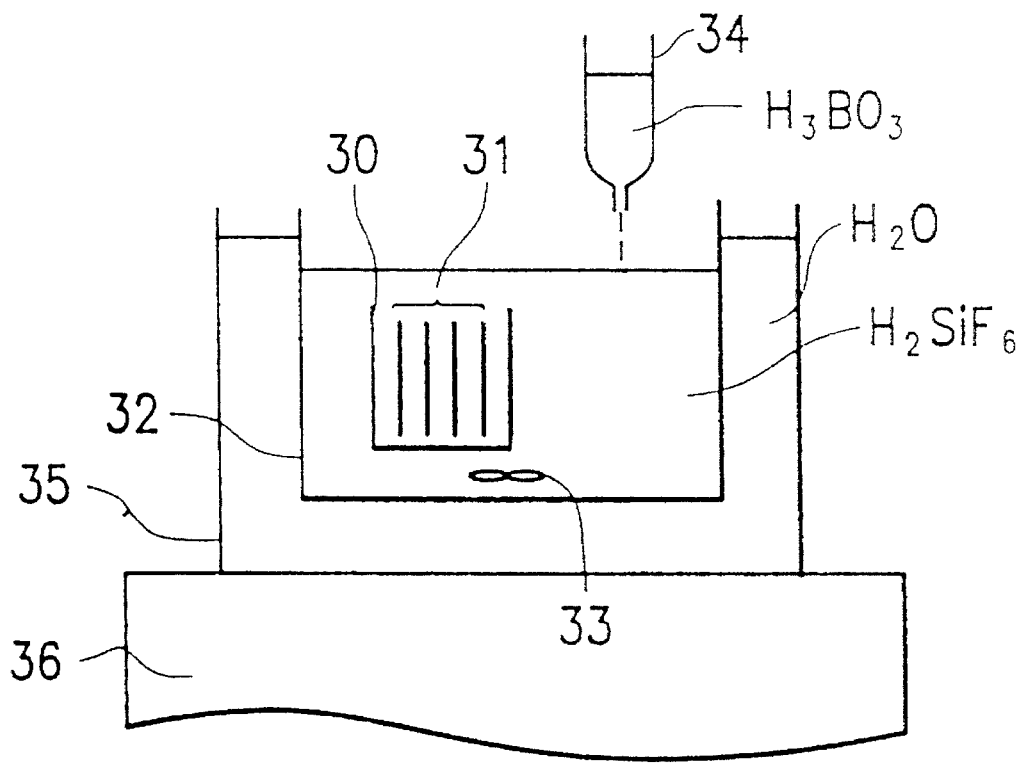
FIG. 3 shows a liquid phase deposition (LPD) device which may be used in connection with the method according to the present invention.

Referring to FIG. 2C, the substrate 20 is placed in a liquid phase deposition device as shown in FIG. 3, to deposit a field oxide 24 to fill the trenches 27. The liquid phase deposition device includes a reactor 32 containing hydrofluosilicic acid ($H_2SiF_6$) as a reactant, a carrier 30 placed in the reactor 32 for holding silicon wafers 31, a stirrer 33 for stirring the reactant, an injector 34 to add boric acid ($H_3BO_3$) into the reactor 32 to keep the hydrofluosilicic acid saturated, a water bath 35, and a temperature controlled heater 36, which maintains the temperature of the water bath 35 between 33° C. and 37° C. The hydrofluosilicic acid ($H_2SiF_6$) is saturated with $SiO_2$ powder. Liquid Phase Deposition of $SiO_2$ is described in the article entitled "A Selective $SiO_2$ Film-Formation Technology Using Liquid-Phase Deposition for Fully Planarized Multilevel Interconnections," J. Electrochem. Soc., Vol., 140, No. 8, August 1993, the disclosure of which is hereby incorporated herein by reference.

Since LPD has a relatively high deposition selectivity, field oxide will only deposit on silicon dioxide or polysilicon, not on other materials such as silicon, tungsten, or photoresist. In the present embodiment, since the surface of the silicon substrate 20 is covered with photoresist 23 (or with tungsten if the photoresist has already been removed), and the side walls of the trenches 27 are covered by tungsten layer 22, the field oxide 24 will only vertically deposit on the bottom of the trenches 27, without lateral deposition. Therefore, no matter how wide the trenches are, flat field oxides 24 with same height will grow in every trench. Thus the field oxides grow anisotropically in trenches 27 and the height of the deposited $SiO_2$ can be easily controlled by controlling the deposition time. The photoresist 23 is removed as shown in FIG. 2C and it may be removed before or after the LPD of the $SiO_2$.

Figure 2D:
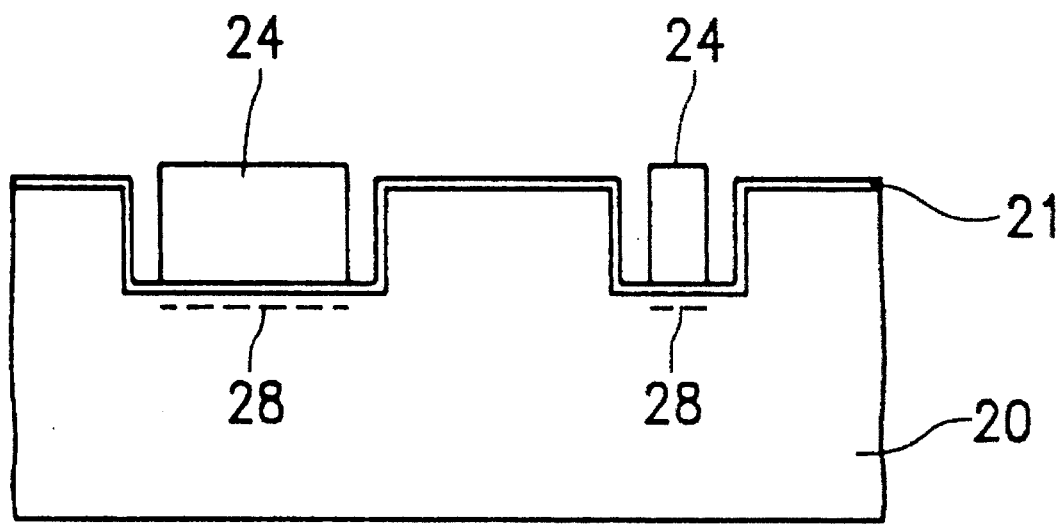

The tungsten layer 22 and Ti:W layer 26 are etched by sulfuric acid or nitric acid. If layer 26 is TiN, it can be etched by aqueous ammonia and hydrogen peroxide. Gaps will be left between the field oxide 24 and the oxide layer 21 as shown in FIG. 2D. The substrate is preferably heated at 800° C. to 1000° C. in an oxygen-free environment for 30 to 60 minutes, to densify the field oxide 24.

Figure 2E:
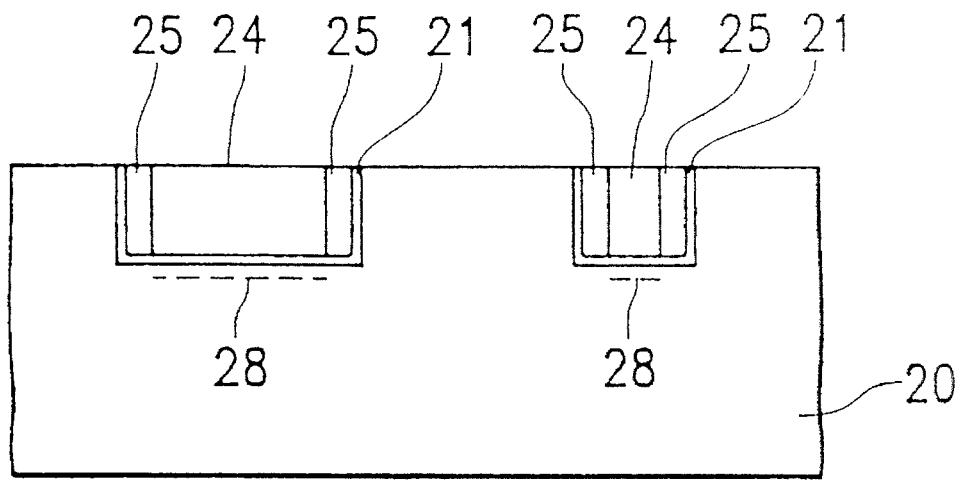

Finally, the sidewall gaps between the field oxide 24 and the oxide layer 21 are filled by depositing and etching back a dielectric layer 25, such as silicon dioxide or silicon nitride, to form a recessed isolating layer using conventional CVD or other deposition techniques. After removing the oxide layer 21 on the silicon substrate 20 by wet etch, a flat isolation structure as shown in FIG. 2E can be obtained using the method according to the present invention.

The aforementioned etching will also etch the field oxide 24 and therefore, when the field oxide is deposited by the aforedescribed LPD process, the height of the field oxide 24 should be adjusted to account for the fact that some of it will be subsequently lost during subsequent etching. As can be seen in comparing FIGS. 2D and 2E, the height of the field oxide 24 is higher than the level of the adjacent substrate before the etching and basically level with it after the subsequent etching.

While the invention has been described by way of examples and in terms of a preferred embodiment, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of forming an isolation structure on a silicon substrate, comprising the following steps:

(a) forming at least one trench in said silicon substrate, the trench having trench sidewalls and a trench bottom;

(b) forming a first oxide layer on a surface of said silicon substrate and on the trench sidewalls and the trench bottom;

(c) adhering a protective layer on the first oxide layer;

(d) coating and patterning a photoresist on the protective layer to expose the trench;

(e) removing the protective layer on the trench bottom by etching using the photoresist as a mask;

(f) forming a second oxide layer in the trench using liquid phase deposition;

(h) removing the photoresist;

(g) removing the protective layer to thereby form gaps between the first oxide layer on the trench sidewalls and the second oxide layer;

(h) forming a dielectric layer to fill the gaps using deposition and etching back the dielectric layer; and (i) removing the first oxide layer on the surface of the silicon substrate.

2. The method of forming an isolation structure on a silicon substrate as claimed in claim 1, wherein said protective layer is formed by first forming an adhesive layer on said first oxide layer and then forming a tungsten layer on said adhesive layer.

3. The method of forming an isolation structure on a silicon substrate as claimed in claim 2, wherein said adhesive layer is titanium nitride.

4. The method of forming an isolation structure on a silicon substrate as claimed in claim 2, wherein said adhesive layer is a titanium-tungsten alloy.

5. The method of forming an isolation structure on a silicon substrate as claimed in claim 1 further including the step of densifying the second oxide layer by heating.

6. The method of forming an isolation structure on a silicon substrate as claimed in claim 1, further including a step of implanting impurities into said substrate to form a channel stop implantation layer.

7. The method of forming an isolation structure on a silicon substrate as claimed in claim 1, wherein the thickness of the first oxide layer is between 50 Å to 200 Å.

8. The method of forming an isolation structure on a silicon substrate as claimed in claim 2, wherein the thickness of the adhesive layer is between 100 Å to 500 Å.

9. The method of forming an isolation structure on a silicon substrate as claimed in claim 2, wherein the thickness of the tungsten layer is between 500 Å to 2000 Å.

10. The method of forming an isolation structure on a silicon substrate as claimed in claim 2, wherein the step coverage ratio of the tungsten layer is between 40% to 95%.

11. The method of forming an isolation structure on a silicon substrate as claimed in claim 1, wherein the critical dimension bias is between 0 to $-0.1$ μm when patterning the photoresist in step (d).

12. The method of forming an isolation structure on a silicon substrate as claimed in claim 1, wherein the liquid phase deposition is performed at 33° C. to 37° C. using saturated hydrofluosilicic acid as a reactant.

13. The method of forming an isolation structure on a silicon substrate as claimed in claim 1, wherein the dielectric layer is silicon dioxide.

14. The method of forming an isolation structure on a silicon substrate as claimed in claim 1, wherein the dielectric layer is silicon nitride.

15. A method of forming an isolation structure on a semiconductor substrate, said method comprising the steps of:

(a) forming at least one trench in said semiconductor substrate, the trench having trench sidewalls and a trench bottom;

(b) forming an oxide layer on at least the trench bottom;

(c) forming a protective layer on said semiconductor substrate and in said at least one trench, said protective layer being provided with an aperture therein over said trench bottom; and (d) forming a field oxide layer on said oxide layer in said at least one trench by liquid phase deposition of field oxide.

16. The method of forming an isolation structure on a semiconductor substrate as claimed in claim 15, further including the steps of:

(e) removing the protective layer and thereby leaving gaps along the trench sidewalls; and (f) filling said gaps along the trench sidewalls with a dielectric material.

17. The method of forming an isolation structure on a semiconductor substrate as claimed in claim 16, further including the step of:

(g) etching away exposed portions of said oxide layer and said dielectric material to form a generally planar flat structure.

18. The method of forming an isolation structure on a semiconductor substrate as claimed in claim 16, wherein said protective layer is formed by forming an adhesive layer over said substrate, forming a tungsten layer over said adhesive layer and patterning to remove those portions of the adhesive layer and the tungsten layer which cover the trench bottom.

* * * * *